Figure 1:
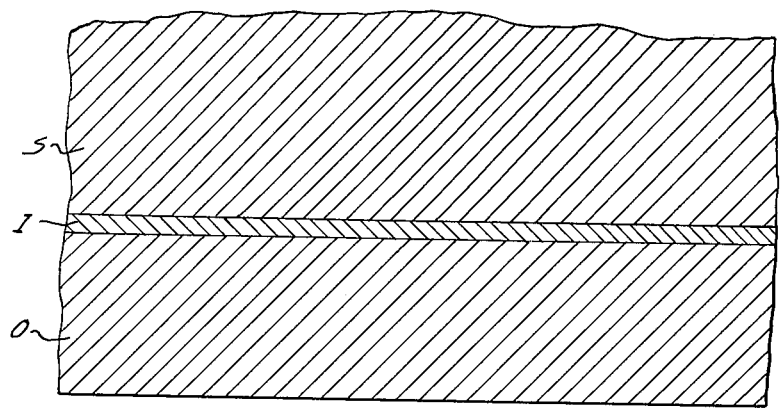

United States Patent [19]

Zaromb

[11] 4,116,751

[45] Sep. 26, 1978

[54] METHODS AND APPARATUS FOR PRODUCING UNSUPPORTED MONOCRYSTALLINE FILMS OF SILICON AND OF OTHER MATERIALS

[76] Inventor: Solomon Zaromb, 171 Clifton Ave., Newark, N.J. 07104

[21] Appl. No.: 620,650

[22] Filed: Oct. 8, 1975

[51] Int. Cl. .............................. B01j 17/30; B01j 17/32
[52] U.S. Cl. .................................... 156/600; 156/610; 156/612; 427/248 J; 156/155; 156/344; 148/175
[58] Field of Search ............... 156/610, 612, 600, 155, 156/344, 17; 427/248 J, 255; 148/175; 23/273 SP, 294

[56] References Cited

U.S. PATENT DOCUMENTS

| 3,382,099 | 5/1968 | Montmory | 156/610 |
| 3,752,717 | 8/1973 | White | 156/155 |
| 3,850,721 | 11/1974 | Schubert | 156/155 |
| 3,899,379 | 8/1975 | Wanesky | 156/155 |

FOREIGN PATENT DOCUMENTS 1,289,831  2/1969  Fed. Rep. of Germany ........... 156/612

OTHER PUBLICATIONS

Finne et al., J. Electrochem Soc.: Solid State Lic., vol. 114, #9, pp. 965-970.

*Primary Examiner*—Stephen J. Emery
*Attorney, Agent, or Firm*—Siegmar Silber

[57] ABSTRACT

This invention deals with methods and apparatus for producing unsupported monocrystalline films of silicon, germanium, gallium aresenide, and many other semiconductors and other materials. Said methods comprise:
- (a) repetitively using a monocrystalline substrate S having a crystal structure closely matching that of the desired films;
- (b) epitaxially depositing on substrate S first an intermediate monocrystalline layer I and next an outer monocrystalline layer O so as to form a three-layer S-I-O configuration, said three layers having closely matching crystal structures; and
- (c) at least partly disintegrating said intermediate layer I so as to free said outer layer O and make substrate S available to repeat the same cycle.

3 Claims, 8 Drawing Figures

METHODS AND APPARATUS FOR PRODUCING UNSUPPORTED MONOCRYSTALLINE FILMS OF SILICON AND OF OTHER MATERIALS

This invention relates to methods and apparatus for producing free monocrystalline thin films of germanium, silicon, gallium arsenide, and other materials for use in the production of inexpensive photovoltaic cells, of various other semiconductor devices, and miscellaneous other objects.

It is a special object of my invention to provide simple and inexpensive processes for the mass-production of thin films of silicon and of other semiconductors for use in the manufacture of low-cost photovoltaic cells and of other semiconductor devices.

It is yet another special object of my invention to effect sufficient reductions in the cost of said photovoltaic cells to permit economical largescale generation of electricity from sunlight.

Although thin films of various polycrystalline materials can be readily formed, it is not easy at the present time to produce a free thin film constituting essentially a single crystal and having a thickness in the range of 5 to 50 microns, and possibly even in the range of 2 to 200 microns. Monocrystalline films can be grown epitaxially on single crystal substrates when the latter have a crystal lattice which closely matches that of the desired monocrystalline film. However, no economical method of separating such monocrystalline films from the substrates has been disclosed so far.

Briefly my invention consists of the following cyclic process:

1. Start with monocrystalline subtrates S whose crystal structure is the same as or closely related to that of the desired free films, said substrates serving as reusable templates.
2. On each of said subtrates S deposit epitaxially first an intermediate layer I and next an outer layer O of different materials having closely matching crystal structures so as to form an S-I-O configuration, as indicated in FIG. 1.
3. Selectively melt, sublime, crack, peel, or otherwise dissociate the intermediate layers O and make the substrates S available for the next cycle.

Figure 2:
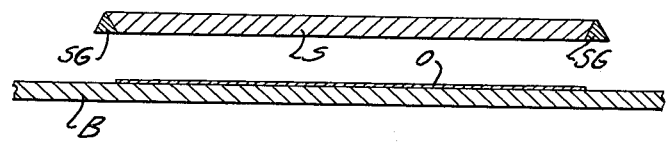
Figure 3:
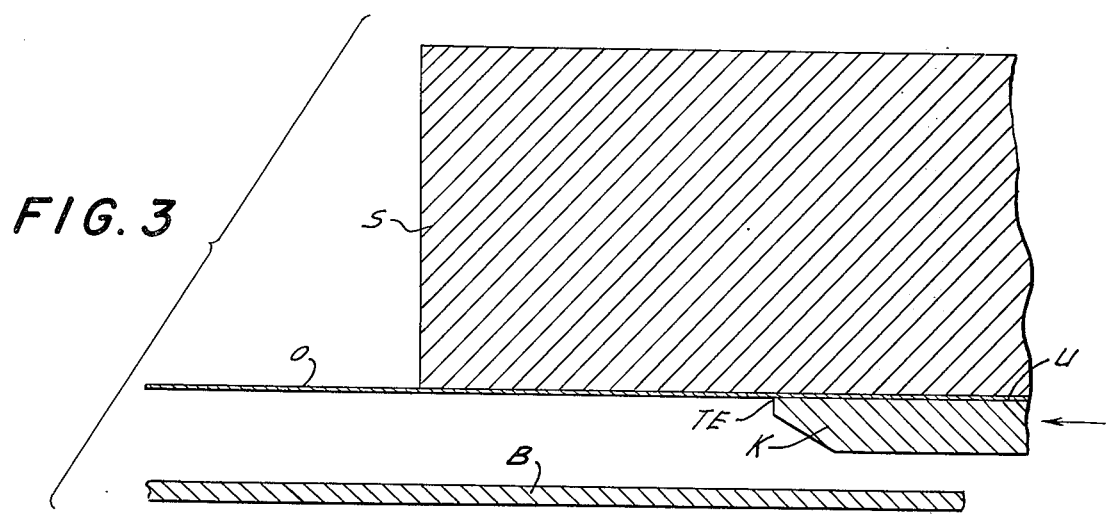
Figure 4:
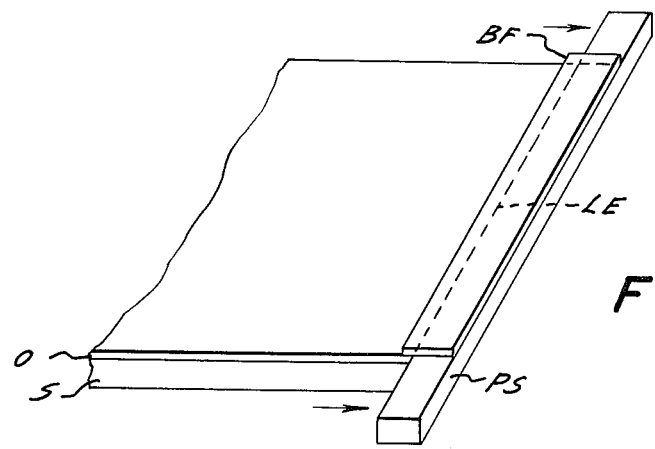
Figure 5:
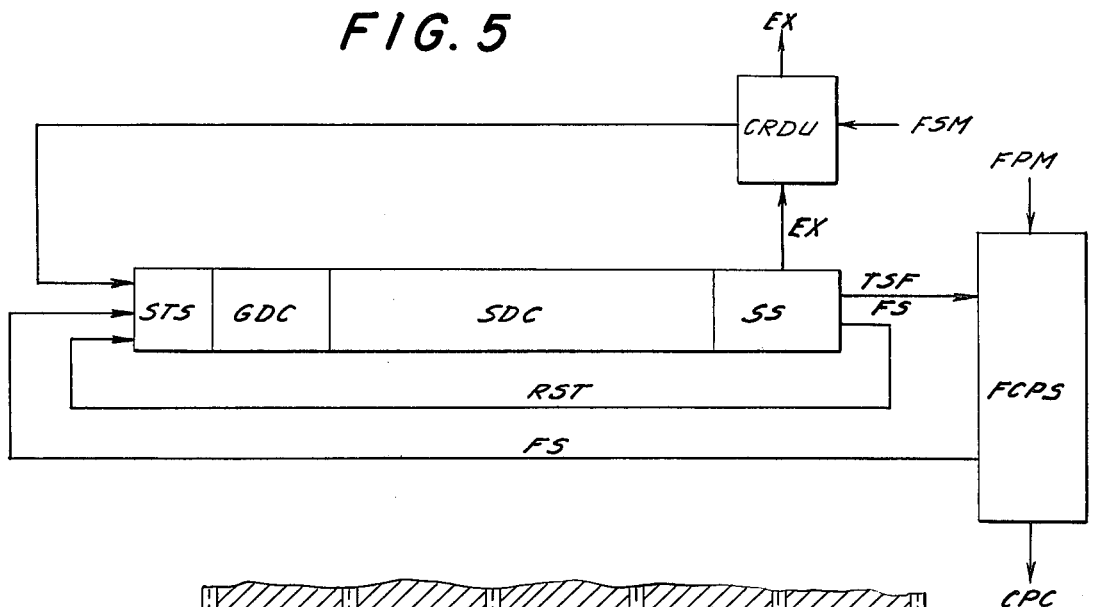

My invention is best explained with reference to the drawing in which:

FIG. 1 is a schematic partial cross-sectional view of the afore-mentioned S-I-O configuration;

FIG. 2 indicates the break-up of the intermediate layer I by cracking or sublimation of at least one of its constituents and the collection of the freed outer layer O on a flat supporting base B;

FIGS. 3 and 4 indicate two alternative separation methods wrein the intermediate layer I is selectively melted and the outer layer O is caused to slide off the substrate S by either being pushed forward by a knife-edge or by pulling action;

FIG. 5 indicates a process flow diagram for the mass-production of silicon photovoltaic cells using one embodiment of my invention.

Figure 6:
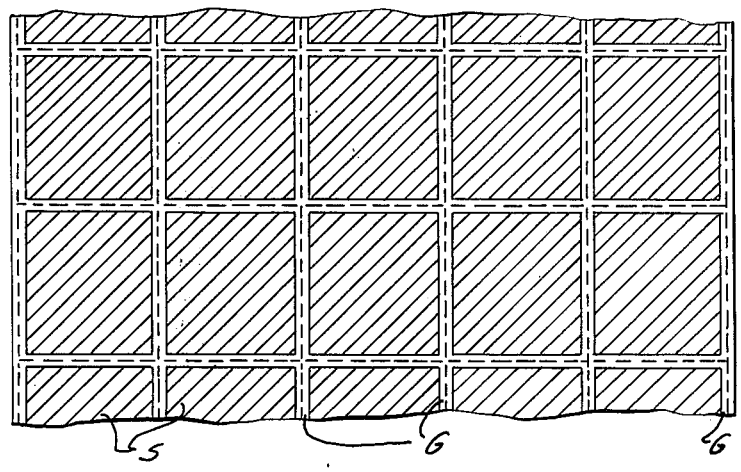
Figure 7:
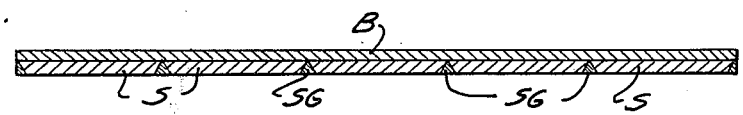
Figure 8:
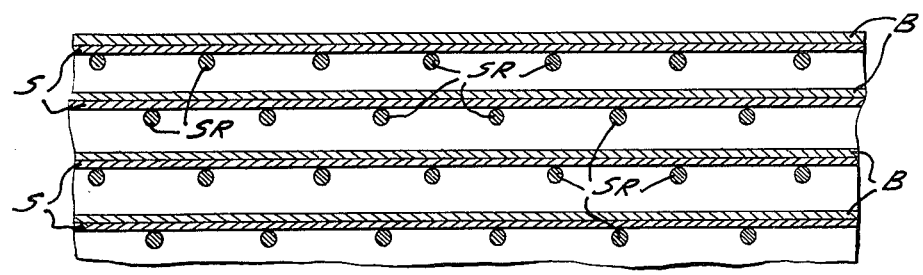

FIGS. 6, 7, and 8 illustrate the disposition of substrates in closely packed arrays for mass-production of silicon films by the process of FIG. 5.

In the S-I-O configuration of FIG. 1 the subtrate S and the outer layer O will most frequently (but not necessarily always) be of the same material. Thus Ge-NaCl-Ge represents the case where S and O consist of germanium, whereas NaCl is used for the intermediate layer I.

In one embodiment of my invention, unsupported monocrystalline films of germanium are produced by hetero-epitaxially depositing first a very thin layer of NaCl on Ge and next a much thicker layer of Ge on the NaCl, both at substrate temperatures of about 530° C. or somewhat lower, and then freeing the outer Ge layer by either:

(1) subliming the intermediate NaCl layer at a temperature of at least 630° C. or thereabouts; or
(2) allowing the Ge-NaCl-Ge configuration to cool to room temperature, thereby causing the very thin NaCl layer to peel off the Ge on account of the large difference between the thermal expansion coefficients of these two materials.

Once the intermediate NaCl layer has sublimed, cracked or peeled, the freed outer Ge film may be allowed to drop down onto the flat supporting base B of FIG. 2. The latter may then carry the free Ge film through the other processing steps required for the device or devices of interest.

In other embodiments of my invention free monocrystalline films of GaAs or Si are produced by first forming a three-layer GaAs-Ge-GaAs or Si-(Ge-Si alloy)-Si configuration, and then melting the intermediate layer of Ge or Ge-Si alloy and sliding the outer GaAs or Si layer off the molten layer. The Ge and GaAs layers are deposited hetero-epitaxially at a temperature below 900° C. and separated at a temperature of about 950° C. or somewhat higher. The intermediate Ge-Si alloy (comprising at least 25 atomic % of Ge) and the outer Si layer may be preferably deposited at temperatures of about 1200°±50° C. and separated at about 1350° C.

The sliding action required by this approach can be effected by either of the two methods indicated in FIGS. 3 and 4. FIG. 3 is a schematic cross-sectional view of a knife-edge K pushing against a trailing edge TE of the outer layer O and causing the latter to slide off the substrate S. To ensure that K pushes against TE (and does not just slide over it) certain precautions are necessary which should be obvious to persons skilled in the art. These precautions include having the upper face U of the knife-edge K pressing firmly against the substrate S from the start of the deposition process through the end of the sliding step. Upon completion of the separation step, the freed layer O may be allowed to drop down onto a supporting base B and carried away for further processing.

An alternative more foolproof way of effecting the sliding action is by having a leading edge LE of layer O joined to a pulling slab PS, as indicated in FIG. 4, and causing PS to pull away from substrate S. One method of having PS joined to layer O might consist of:

(i) masking off all but a short exposed portion of layer O near its leading edge LE;
(ii) moving the slab PS all the way up to LE and with one of its surfaces approximately co-planar with said exposed portion of layer O; and
(iii) depositing a bridging film BF of about the same composition as that of layer O on both exposed co-planar surfaces so as to form a bridge between them.

The slab PS should be preferably of about the same composition as that of the layer O to ensure good adhesion of the bridging film BF, and the latter may be deposited at a rapid rate without regard to crystalline perfection. Once the separation step has been completed, the exposed bridging portion of layer O may be severed from the rest of the free monocrystalline thin film by a scissor-like or guillotine-like device.

The afore-outlined deposition-melting-sliding approach is applicable not only to the formation of free monocrystalline films of GaAs or Si, but also to a host of other substances. Table I lists films of a few semiconductors of possible interest together with the proposed intermediate layers. Of course, my invention need not be limited to semiconductors, but should be applicable equally well to a variety of insulators, metals, and other electrically conducting materials.

TABLE 1.

OF FREE MONOCRYSTALLINE THIN FILMS BY THE MELTING-SLIDING TECHNIQUE

| (Desired Films | Intermediate layer |
| --- | --- |
| Si | Ge-Si |
| AlP, GaP or BeTe | Si |
| Zns | Ge |
| AlAs | Ge or GaAs-AlAs alloy |
| GaAs | Ge |
| ZnSe | Ge |
| CdS | Ge or CdS-HgS alloy |
| InP | InAs or InP-InSb alloy |
| InAs | InAs-InSb alloy |
| AlSb | GaSb or GaSb-AlSb alloy |
| GaSb | GaSb-InSb |
| ZnTe | ZnTe-HgTe |
| CdSe | CdTe-CdSe |
| CdTe | CdTe-HgTe |
| HgTe | InSb or α-Sn |
| HgSe | HgS or HgTe-HgSe alloy |
| PbSe | PbSe-PbTe alloy |

The procedures for depositing the above-discussed epitaxial layers are well known to persons skilled in the art. These may include vacuum evaporation, sputtering, liquid-growth epitaxy, and other known techniques, but the preferred method would involve chemical vapor deposition (CVD), wherever practical. For instance, silicon can be grown epitaxially by CVD using either silane or various mixtures of hydrogen and the halosilanes, especially the chlorosilanes ($SiCl_4$, $SiHCl_3$, $SiH_2Cl_2$ or $SiH_3Cl$). The deposition temperatures for satisfactory epitaxial growth of silicon may range from less than 1000° C. to over 1300° C., but the optimum growth temperatures for obtaining free monocrystalline Si films of high crystalline perfection appear to be in the range of 1100° C. to 1250° C.

A preferred embodiment of my invention is the production of free monocrystalline silicon films, for the use in the manufacture of photovoltaic cells, by resorting to the Si-GaP-Si configuration. The entire process is outlined schematically in FIG. 5.

In this process, a gaseous silicon compound such as $SiH_4$, $SiCl_4$ or another halosilane may constitute the most costly major starting material. For the production of free monocrystalline films, the starting materials FSM, including the selected silicon compound or compounds together with appropriate concentrations of hydrogen, gallium, and phosphorus compounds, and any desirable dopants, may be supplied via a chemicals reprocessing and distributing unit CRDU to an epitaxial treatment chamber ETC. The latter may be subdivided into a surface treatment section STS (where the substrate surfaces are to be properly prepared for satisfactory epitaxial growth), a GaP deposition chamber GDC, a silicon deposition chamber SDC, and a separation section SS. Exiting from the latter are:

(a) the film supports FS carrying the free monocrystalline thin silicon films TSF and passing through a final cell processing section FCPS before returning to ETC;

(b) the reusable substrate templates RST being returned to the epitaxial deposition chamber ETC; and (c) gaseous exhausts EX from the ETC to the CRDU. Other gaseous exhausts (not shown in FIG. 5) may be fed into CRDU from STS, GDC, and SDC, and partly reprocessed in the CRDU or rejected therefrom.

The monocrystalline thin silicon films TSF leaving the ETC, as well as the final processing materials FPM, are fed into the FCPS, where they undergo a few final processing steps, including surface passivation, formation of ohmic contacts, and encapsulation in an appropriate plastic supporting and protective material, and finally exit from the FCPS in form of completed photovoltaic cells CPC.

The process outlined in FIG. 5 utilizes the high-temperature dissociation of GaP into phosphorus vapor and liquid gallium to effect the separation of the silicon film from the substrate. Although GaP melts at a rather high temperature, it develops a dissociation pressure in excess of 0.1 atmosphere at temperatures in excess of about 1250° C. Therefore, if the total pressure in the separation section SS is kept substantially below 0.1 atmosphere, the vapor pressure of phosphorus in the intermediate layer should suffice to overcome the adhesive forces between the Si layers and the dissociating GaP and blow the layers apart when the temperature exceeds around 1250° C. If the vacuum in the separation section is below 10 Torr, a temperature of 1150° C.–1200° C. may suffice for an effective separation of the outer layer. There is thus a fairly wide range of temperatures at which the separation step can be conveniently effected.

As indicated in FIGS. 1 and 2, the intermediate and outer layers I and O should be preferably deposited on the lower horizontal face of the subtrate S so that the outer layer O could be caused to fall off substrate S onto a nearby supporting base B when the vapor pressure of phosphorus in the intermediate layer exceeds the total pressure in SS, FIG. 5, plus the forces of adhesion between molten Ga and solid Si.

To prevent premature dissociation of the GaP in the silicon deposition chamber SDC, the latter will have to be preferably maintained at a temperature below 1100° C. or less and contain a phosphorus vapor pressure in the reaction chamber sufficient to prevent the GaP from dissociating, at least in the initial silicon deposition stage. Once the GaP has been fully covered, the outer Si layer may constitute an adequate barrier to the escape of phosphorus from the intermediate layer, even in the absence of phosphorus vapor, provided that the total pressure exceed the dissociation pressure of GaP. It may then be possible to substitute a neutral or an acceptor-yielding compound for the phosphorus vapor (so as to form a p-n junction during the epitaxial growth step) provided that certain precautions be taken to prevent the escape of an excessive amount of phosphorus from the intermediate layer through any exposed edges.

Another essential precaution is that any temperature changes during the growth and separation steps be gradual and uniform over the entire layer so as to prevent a non-uniform distribution of the pressure differences across the outer layer, especially during the separation step. Such a non-uniform pressure distribution might give rise to phosphorus vapor bubbles between the intermediate and outer layers, and hence in stresses, deformation, and related flaws in the thin epitaxial Si films.

However, it should be possible to prevent such bubble formation by keeping both the temperature non-uniformities and the pressure differences to the minimum, namely by effecting any necessary temperature changes at a gradual rate, ensuring that the total chamber pressure is sufficient to prevent bubble formation until the temperature has been equilibrated, allowing adequate time for such temperature equilibration, and then gradually reducing the ambient pressure until the outer layer has fallen off the substrate.

The foregoing changes in temperature and phosphorus vapor pressure may be effected gradually as the substrates are moved continuously at a controlled rate into separate controlled temperature and controlled pressure zones of the silicon deposition chamber SDC and of the separation section SS of FIG. 5.

For economical mass-production of silicon photovoltaic cells, large numbers of subtrates S packed densely within moving supporting grids SG should be circulated continuously through the epitaxial treatment chamber ETC. A typical supporting grid SG as viewed from underneath would appear as indicated in FIG. 6. The view of a vertical cross section perpendicular to the plane of FIG. 6 is shown in FIG. 7. On top of each SG and in intimate contact with it may be resting the base B which is to collect the films separated from the next higher layer of subtrates, said higher layer being shown in FIG. 8. The bases B may also serve as masks for the upper faces of the subtrates on which they are resting, as indicated in FIG. 7. As indicated in FIG. 8, the arrays of substrates S covered by bases B may be resting on and be free to move relative to fixed supporting rods SR within the epitaxial treatment chamber ETC.

For an order-of-magnitude estimate of the rate at which photovoltaic cells may be produced by this process with equipment of reasonable size, let us assume that the epitaxial treatment chamber ETC has an internal working volume of about $5 \times 5 \times 40$ inches. Furthermore, since the deposition of outer layer O should take much longer than the other epitaxial treatment steps, let us assume that the silicon deposition chamber SDC takes up at least half of this total working volume, i.e., $5 \times 5 \times 20$ inches. Then, if the arrays of substrate templates and supports are arranged as indicated in FIGS. 6 and 8, the total exposed substrate area of a single $4\frac{3}{4} \times 20$ inches array would equal 525 square centimeters. With the arrays spaced $\frac{3}{8}$ inch apart, a volume of $5 \times 5 \times 20$ inches would accomodate a total exposed substrate area of about 0.68 square meter. Assuming a deposition rate of about 1 micron/minute and an outer layer thickness of about 30 microns, we arrive at an estimated silicon cell production rate of at least 1.4 square meter per hour.

There will now be obvious to those skilled in the art many modifications and variations of the aforedescribed methods and apparatus, which, however, will not depart from the scope of my invention if outlined by the following claims:

I claim:

1. A method of producing unsupported monocrystalline films which comprises:
    (a) providing at least one reusable monocrystalline substrate S having a crystal structure closely matching that of the desired films;
    (b) epitaxially depositing on the lower surface of substrate S first an intermediate monocrystalline layer I and next an outer monocrystalline layer O so as to form a three-layer S-I-O configuration, said three layers having closely matching crystal structures;
    (c) reducing the ambient pressure below the vapor pressure of at least one component of said intermediate layer I, or raising the temperature of said intermediate layer so as to raise the vapor pressure of at least one of its components above the ambient pressure, thereby blowing off said outer layer O and causing it to fall by gravity onto a supporting base; and
    (d) recycling substrate S.

2. A method as claimed in claim 1 which also comprises repeatedly circulating said reusable substrate through separate zones, including said steps b and c, in a continuous process.

3. A method as claimed in claim 1 wherein said outer layer comprises silicon and said intermediate layer comprises gallium phosphide.

* * * * *